(12) United States Patent
Yee et al.

(10) Patent No.: US 6,510,545 B1
(45) Date of Patent: Jan. 21, 2003

(54) AUTOMATED SHIELDING ALGORITHM FOR DYNAMIC CIRCUITS

(75) Inventors: Gin S. Yee, Sunnyvale, CA (US); Ronald T. Christopherson, San Bruno, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/488,915

(22) Filed: Jan. 19, 2000

(51) Int. Cl.[7] .............................................. G06F 17/50
(52) U.S. Cl. ............................. 716/12; 716/13; 716/14; 716/15; 716/16
(58) Field of Search ........................ 716/1–18; 174/250, 174/260–266; 361/760, 761, 794; 29/830, 852; 257/692, 700; 326/24, 27, 86, 90

(56) References Cited

U.S. PATENT DOCUMENTS

| | | | | |
|---|---|---|---|---|
| 5,491,301 A | * | 2/1996 | Akiba et al. ................. | 174/250 |
| 5,499,445 A | * | 3/1996 | Boyle et al. .................. | 29/830 |
| 5,761,080 A | * | 6/1998 | DeCamp et al. ............... | 716/5 |
| 5,825,661 A | | 10/1998 | Drumm ....................... | 364/491 |
| 5,850,348 A | | 12/1998 | Berman ....................... | 364/488 |
| 5,867,396 A | | 2/1999 | Parlour ....................... | 364/489 |
| 5,910,730 A | * | 6/1999 | Sigal ........................... | 326/24 |

FOREIGN PATENT DOCUMENTS

| | | | | |
|---|---|---|---|---|
| GB | 2261991 | * | 6/1993 | .................. 15/434 |

* cited by examiner

*Primary Examiner*—Vuthe Siek
*Assistant Examiner*—Naum Levin
(74) *Attorney, Agent, or Firm*—Sierra Patent Group, Ltd.

(57) ABSTRACT

An automated shielding tool, algorithm, and design methodology for shielding integrated circuits is disclosed herein. This is accomplished by inserting VDD and VSS wire proximate to signal wires on the same metal layer. The noise issues for dynamic circuits is described along with the benefits and costs of wire shielding. The methodology of the shield tool is a systematic approach for dealing with noise due to capacitive and inductive coupling.

25 Claims, 12 Drawing Sheets

SHIELD

SIGNAL

M3 JOG

AUTOMATED SHIELDING ALGORITHM FOR DYNAMIC CIRCUITS

BACKGROUND OF THE INVENTION

1. Field of the Invention

The present invention relates to the shielding of circuits in order to reduce capacitive coupling. More particularly, the present invention relates to an algorithm and CAD tool which designs and generates a shield grid of wires on the power and ground nets of circuits. Shielding is particularly appropriate for dynamic circuits due to their low switching threshold.

2. The Background Art

Dynamic circuits have become necessary for designing high speed and compact circuits, as seen by their use in microprocessors. A domino circuit is a specific type of dynamic circuit wherein the value or logic state is typically held by a capacitor or a weak keeper. One of the main reasons domino circuits are so fast is their low switching threshold. For this same reason, domino circuits also have lower noise margins than static CMOS circuits. In state-of-the-art processes, capacitive coupling on victim wires can push a low signal well above 50% of VDD and cause even static circuits to fail. Capacitive coupling is recognized as one of the most significant contributors of noise to circuits that effect delay and functionality. Other forms of noise, like ground bounce, are much harder to reduce, and have to be tolerated by domino gates. One approach to designing robust dynamic blocks is with wire shielding to nullify aggressor capacitive coupling. A tool and methodology have been developed to implement wire shielding.

A low switching threshold gives dynamic circuits their high speed, but also leads to adverse side effects. A typical domino OR2 gate (also known as a "2 input OR gate) is shown in FIG. 1. The reason dynamic gates are fast is the same reason for their lower noise margin, and hence their greater susceptibility to noise than static CMOS. As a consequence, noise is a significant problem since dynamic logic is often employed. Noise comes in the form of charge sharing, charge loss due to capacitive coupling on inputs, IR drop on power wires, leakage and ground bounce. Charge sharing can be prevented by using extra precharge devices to precharge internal nodes. Leakage is controlled with a keeper.

Voltage noise at the inputs of domino gates can cause charge loss at the outn node fairly easily, as shown in FIG. 2. When X switches high, it causes a glitch on node A through the capacitance between the wires, 10 and 20, $C_c$, 30. The capacitance $C_c$, 30 is noise created capacitance. The size of the glitch and the mount of charge loss depends on: the value of $C_c$; the slew rate of X; the resistance of the wire from the driver of A to where the glitch occurs, $V_{tn}$ (nMos voltage threshhold) and the wire capacitance to ground $C_g$. The charge loss is exacerbated when there are two aggressor wire neighbors to A, and when more than one gate input has coupling noise. The charge loss at the outn node can easily lead to functional failure and cause out to switch high with multiple glitches on the same or other inputs.

Although the use of a keeper helps a domino gate recover from charge loss, it is usually too small to prevent the charge loss. Capacitive coupling to the outn or outgoing node of domino gates can be prevented by shielding the node with VDD or VSS wires. As process technology scales, wire dimensions become narrower, 50 and taller 55, as shown in FIG. 3. This reduces $C_g$ and increases $C_c$, which makes capacitive coupling from an aggressive neighbor worse and reduces the non-aggressor coupling to a DC wire, $C_g$. The metal above, 60 and the metal below 65 are assumed to be at VSS.

Several methods are available for reducing charge loss due to capacitive coupling. These include increasing wire spacing, increasing wire width, adding VDD and VSS shields between wires, as shown in FIG. 4, increasing victim driver strength, and reducing aggressor driver strength.

Voltage noises in the form of ground bounce can also cause charge loss. This occurs when ground bounce brings VSS above 0V at the input driver or below 0V at the domino gate receiver, as shown in FIG. 5. Another form of voltage noise is IR drop on signal wires and the VSS wire distribution grid. Because of the voltage drop across a wire, a low input may not be at 0V if V1 is greater than V2, as shown in FIG. 5. Ground bounce and IR drop can be reduced by using more pads/bumps for VDD and VSS, wider VDD and VSS wires, shorter signal wires using repeaters, and better substrate taps and guard rings.

SUMMARY OF THE INVENTION

The invention is a shielding method to reduce capacitively and inductively coupled noises on inputs to dynamic gates and other types of circuits from adjacent wires. The invention minimizes the amount of capacitively coupled noise, ensuring predictable timing of signals along paths and allowing full completion of signal routing with short design time. This is accomplished by inserting VDD and VSS wires on both sides of signal wires on the same layer. A systematic shielding strategy is also disclosed.

DETAILED DESCRIPTION OF ONE EMBODIMENT

Figure 1:
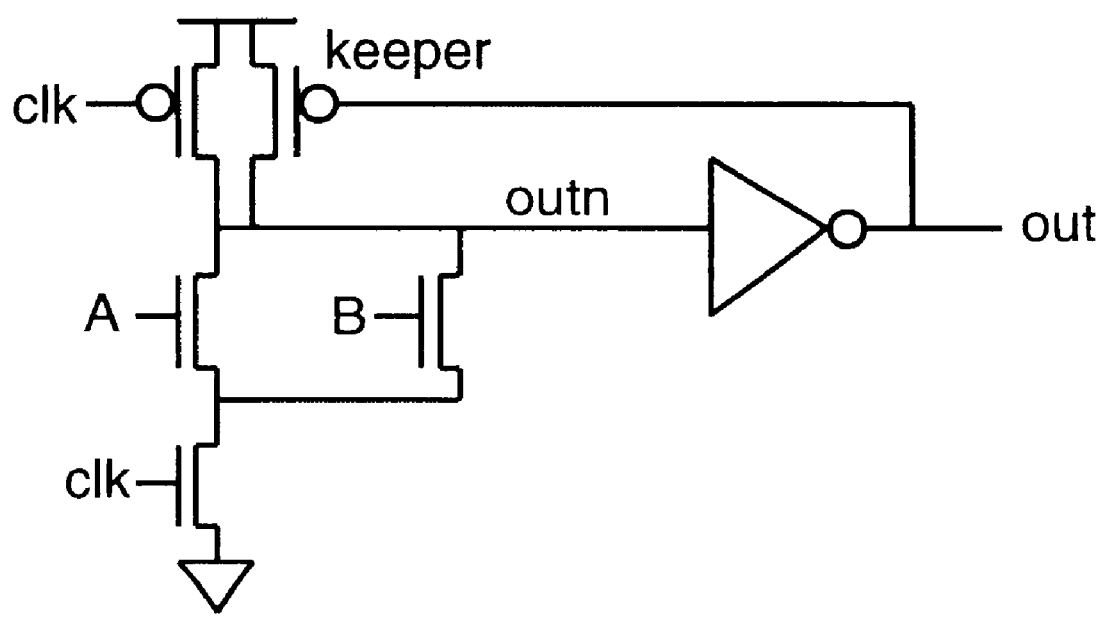
FIG. 1 is a schematic of a typical domino OR2 gate (2 input OR gate) with a $V_{tn}$ input threshold.
Figure 2:
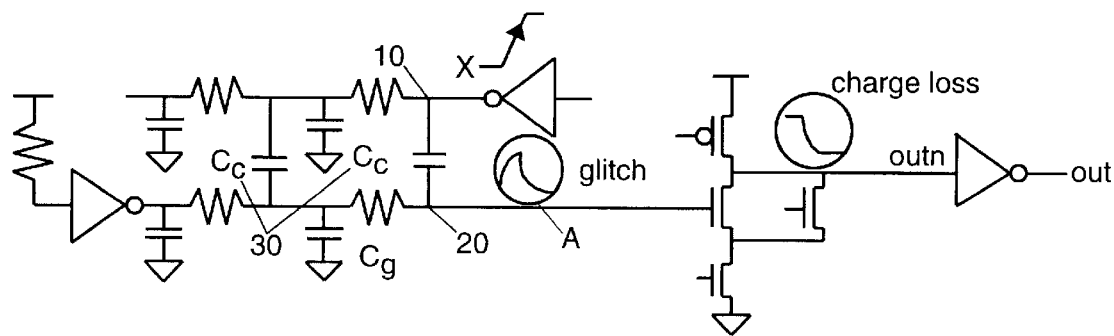
FIG. 2 is a schematic which shows charge loss due to noise inputs to a domino OR2 gate (2 input OR gate).
Figure 3:
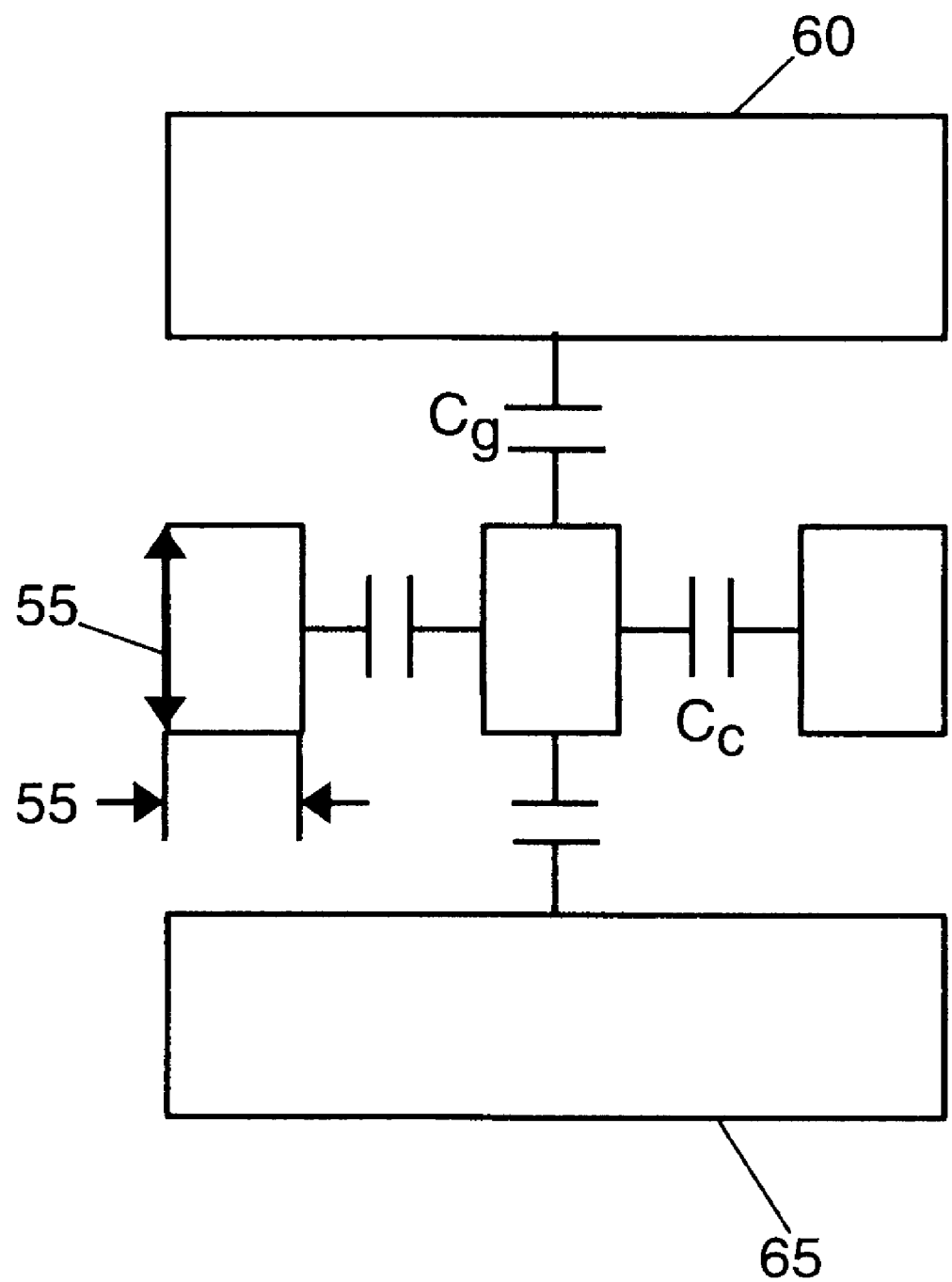
FIG. 3 is a cross sectional view of wire dimensions as process technology scales.

Those of ordinary skill in the art will realize that the following description of the present invention is illustrative only and not in any way limiting. Other embodiments of the invention will readily suggest themselves to such skilled persons who are familiar with this disclosure.

The present invention provides a shielding strategy to reduce capacitively coupled noise on inputs to dynamic gates from adjacent wires. It is an object of the present invention to minimize the amount of capacitively coupled noise, ensure predictable timing of signals along paths, and allow full completion of signal routing with a short design time. This is achieved by inserting VDD and VSS wires on both sides of signal wires on the same metal layer. It is assumed that signals from metal layers above and below the layer of interest are at VSS; this assumption may not hold if a large bus is routed in the layers above or below. It is also assumed that most of the coupling is from neighboring wires on the same metal layer.

As process technology scales the line to line capacitance as a percentage of total wire capacitance exceeds 50% beyond the 0.35 um process generation. It is further assumed that enough spacing between cells and rows can be added to increase the routing tracks for signals. The last assumption is that it is desirable to equalize the amount of extra capacitance, and thus the charge injected, to VDD and VSS due to the extra wire capacitance from the shields. If the last assumption is not used, then only VSS shields should be used for domino circuits.

For submicron technologies, VDD and VSS shield wires should be sufficient to reduce noise well below 10% of VDD. In cases where minimum width and spacing rules used for shields are not sufficient to reduce noise below the noise margin of receivers, increasing shield wire width and/or spacing between wires and shields may be necessary.

The choice of VDD or VSS or a combination of both to tie the shield wires depends on the circuit being implemented. Monotonically rising circuits, like nMOS domino circuits, have signals that can only switch from low to high (VSS to VDD) or stay low during the period their data is valid (evaluation period). Ground (VSS) bounce causes a failure in the nMOS domino circuits when the driver is at a higher VSS voltage than the receiver. In this case, tying all shield wires to VSS reduces the voltage difference on VSS between the driver and receiver. For monotonically falling circuits like pMOS domino circuits, tying all shield wires to VDD is preferred for the similar reason given for monotonically rising circuits. A third class of circuits have indeterminate switching characteristics when their data is valid, their outputs can switch high or low many times before settling. An example is static CMOS circuits. In this case, alternating VSS and VDD connections to shied wires is preferred. In all of the above cases, inductive and capacitive coupling is reduced by having a stable conductor (shield) next to a signal wire.

Figure 4:
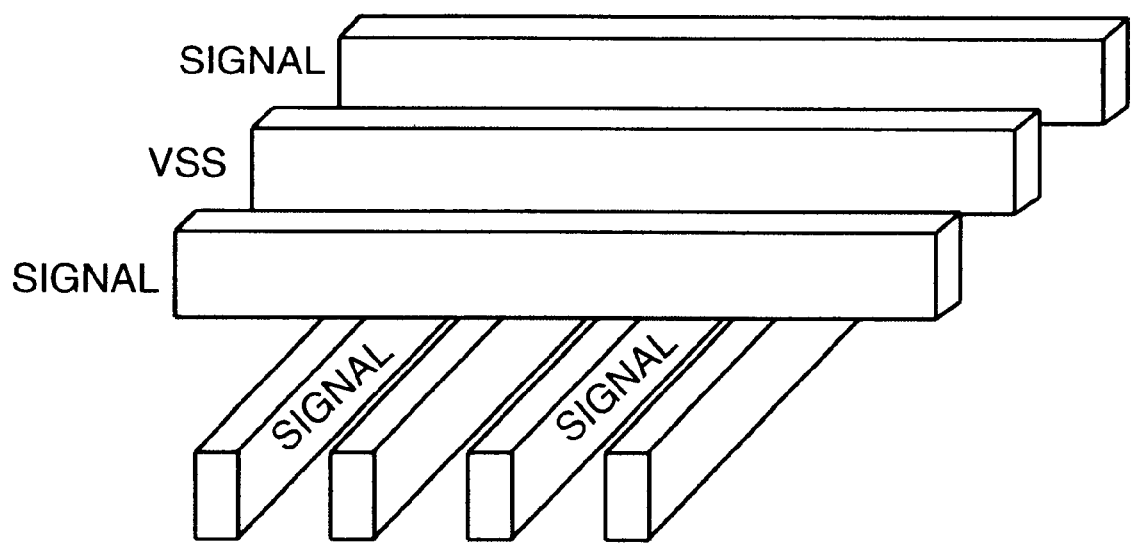
FIG. 4 shows the usage of VDD and VSS shields to reduce capacitive coupling.
Figure 5:
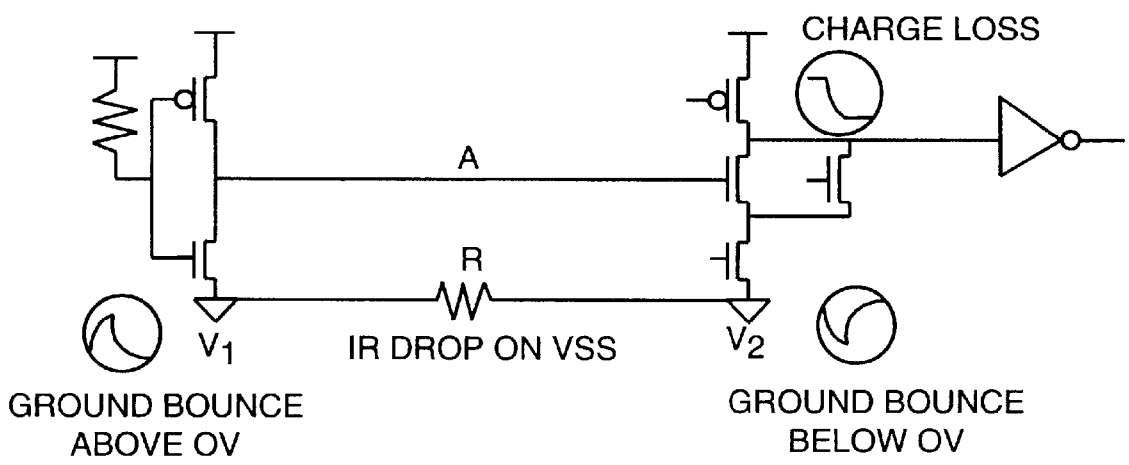
FIG. 5 is a schematic which shows the charge loss in domino gates due to ground bounce above 0V at the driver or below 0V at the receiver.
Figure 6:
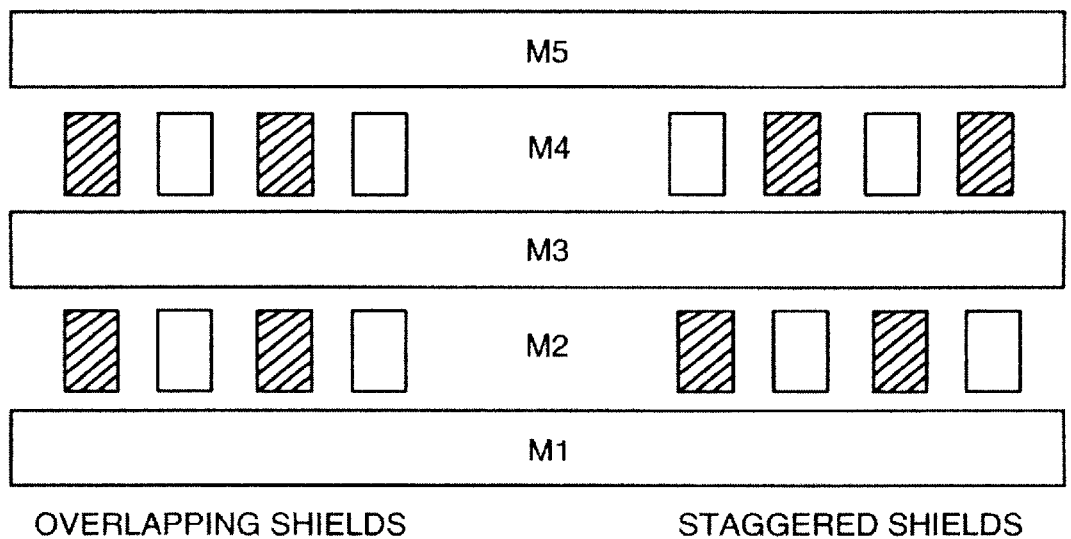
FIG. 6 is a cross section of FIG. 4 showing the shielding topography with overlapping and staggered shields.

Two full shielding topologies can be implemented. The first has metal shields of every even layer and shields of every odd layer overlapping each other, and every signal is shielded on both sides, as shown in FIG. 6. FIG. 6 is a cross section of FIG. 4, where shielding layers M1, M3 and M5 are horizontal wire segments. A second topology has the metal shields of even and odd layers staggered also shown in FIG. 6. This topology reduces the coupling of wires between M2 and M4, and between M1 and M3. Coupling between these layers may not be an issue if it is assumed that routing layers of the orthogonal direction act as ground planes. For example, if M3 is a fully shielded layer, half of the M3 wires are VSS or VDD and block field lines from M2 to M4.

Figure 7:
FIG. 7 shows shielding topography with an M3 jog needed with staggered shields.
Figure 7:
Figure 7:
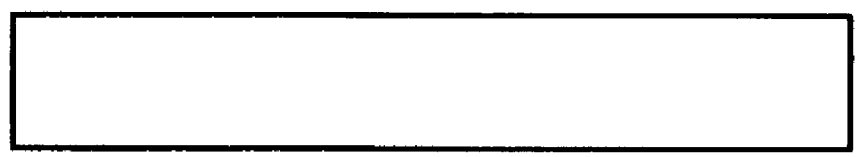
Figure 7:
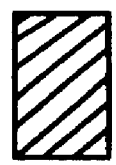
Figure 7:
Figure 7:
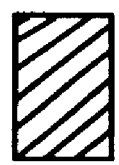
Figure 7:
Figure 7:
Figure 7:
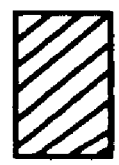
Figure 7:
Figure 7:
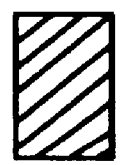
Figure 7:

A drawback of the topology in FIG. 6 is that signals from M2 to M4 need to make a short jog in M3, rather than go straight from M2 to M4 with stacked vias. This is shown in FIG. 7. Another consideration for shielding is that pins on M1 may be blocked by M2 shields. To avoid this, holes in the M2 shields must be cut around the M1 pins so that the router can access them. This is discussed in more detail below. Also, local usage of M2 and M3 for interconnect in cells require cuts around them in the M2 and M3 shields so that those local wires are not shorted to the shields. Because holes are cut in the shields, some amount of coupling will be present between signals.

Figure 8:
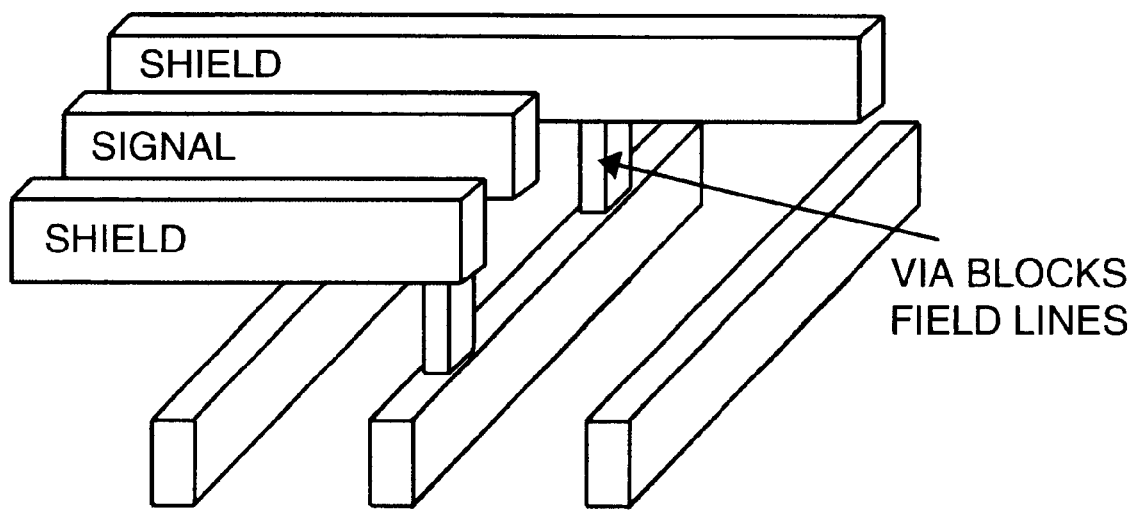
FIG. 8 shows shielding topography of Vias used to help reduce field lines between signal wires.

There are several benefits to shielding. Shields help reduce the effect of supply bounce while creating a finer power distribution grid and allowing a reduction in the primary power distribution wires. Shielding increases the capacitance and surface area of VSS and VDD and the number of return paths for reduced inductive coupling. Shielded blocks have minimal noise by construction even with process variations and when they are ported to future processes. Shielded wires scale with the length so that longer wires automatically have more capacitance to VSS and VDD. Also, the vias needed to connect the shield grid help block the field lines, as shown in FIG. 8. The reduction in field lines by vias is given by the following equation:

$$\% \text{ reduction} = \text{via width}/(2 \times \text{wire width} + 2 \times \text{wire spacing}) \times 100\%$$

The use of shields makes the timing of nets predictable, whereas unshielded nets can have capacitive coupling from a neighbor that ranges from 0 to 2Cc, assuming equal slew rates and switching times. The capacitive coupling range can be <0 and >2Cc if unequal slew rates and switching times are assumed for unshielded nets, thus the timing window for a path is also increased. However, the drawbacks of shielding include an area/routability penalty since the shields take up routing resources. Also, shields introduce blockages and a good areas router is needed to handle them.

Most industrial routers are not able to handle the shielding of wire where nearly all of the nets have to be shielded. One approach to deal with this without a great deal of manual effort is to insert shield wires between routing tracks before routing the actual signals, as described above. One extreme is to place VDD and VSS wires on every other routing track on all routing layers for a block. The general formula is that a shield every Nth routing track will allow (1−1/N) routing tracks for signals. Full shielding is done when N=2.

Figure 9:
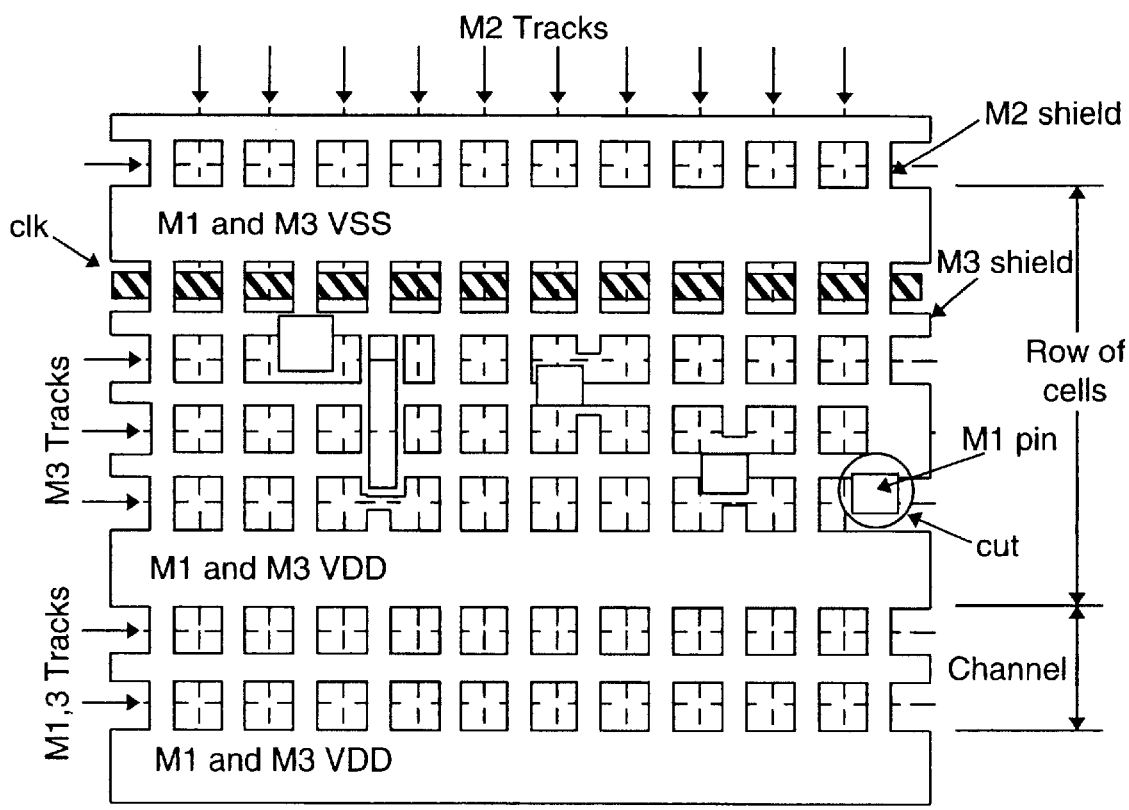
FIG. 9 is an example of shielding topography used for routing M1, M2 and M3.

The shielding strategy described above is implemented according to the present invention. An example of shielding every signal from its neighbor (N=2) is shown in FIG. 9. In the figure, M1 is used for local interconnect within cells and intercell routing in channels. M2 and M3 are also used for over-the-cell routing of signals. Cuts in the M2 shield are needed to allow access to M1 pins by the router from M2 that would otherwise be blocked by the M2 shield. M2 and M3 local interconnect within complex cells, like flops and latches is handled by the tool, which makes cuts in the shield on the appropriate layers to prevent shorting to VDD or VSS.

After the pin locations are obtained from the placed block and written to a text file, the information is used to generate the cuts in the shield. The shield tool also inserts a clock grid for the dynamic gates. VSS and VDD wires for power distribution to the cells are also inserted with the shields. The block size, spacing of the wires, wire widths, power wire widths, and other process dependent information is provided in a technology file read by the shield tool. The algorithm which is used to determine shield locations and cuts is given in Appendix A. First, the tech and design file, M1 pin locations and M2 and M3 blockage locations are read in. Next the program systematically addresses each grid and application.

Next, for each vertical M2 shield, each M1 pin and M2 blocking location is checked to determine if the M2 shield grids overlap. If there is overlap, the overlapping shield cuts are merged. After this is done for all vertical M2 shield grids, the method then moves on to the Horizontal M3 shield grids and performs a similar query and takes similar action. After completing the check for the Horizontal M3 shield grid, the method then addresses the Vertical shield grid and sets cuts for the Vertical shield grid. After completing the Vertical M2 shield grid, the method addresses the Horizontal M3 shield grid and sets cuts. After completion, the method then adds M3 clock wires, M1 and M3 VDD and VSS wires along with Vias for the VDD and VSS power lines and shields.

After inserting shield wires over the entire block with N number of signal tracks between shield wires, sensitive signals (to noise, timing, etc.) can be routed on tracks closest to stable conductors (e.g., VDD, VSS). After routing of all sensitive signals is completed, segments of shield wires that are not adjacent to any routed signal wire can be removed to free up routing tracks for non-sensitive signals.

Figure 10:
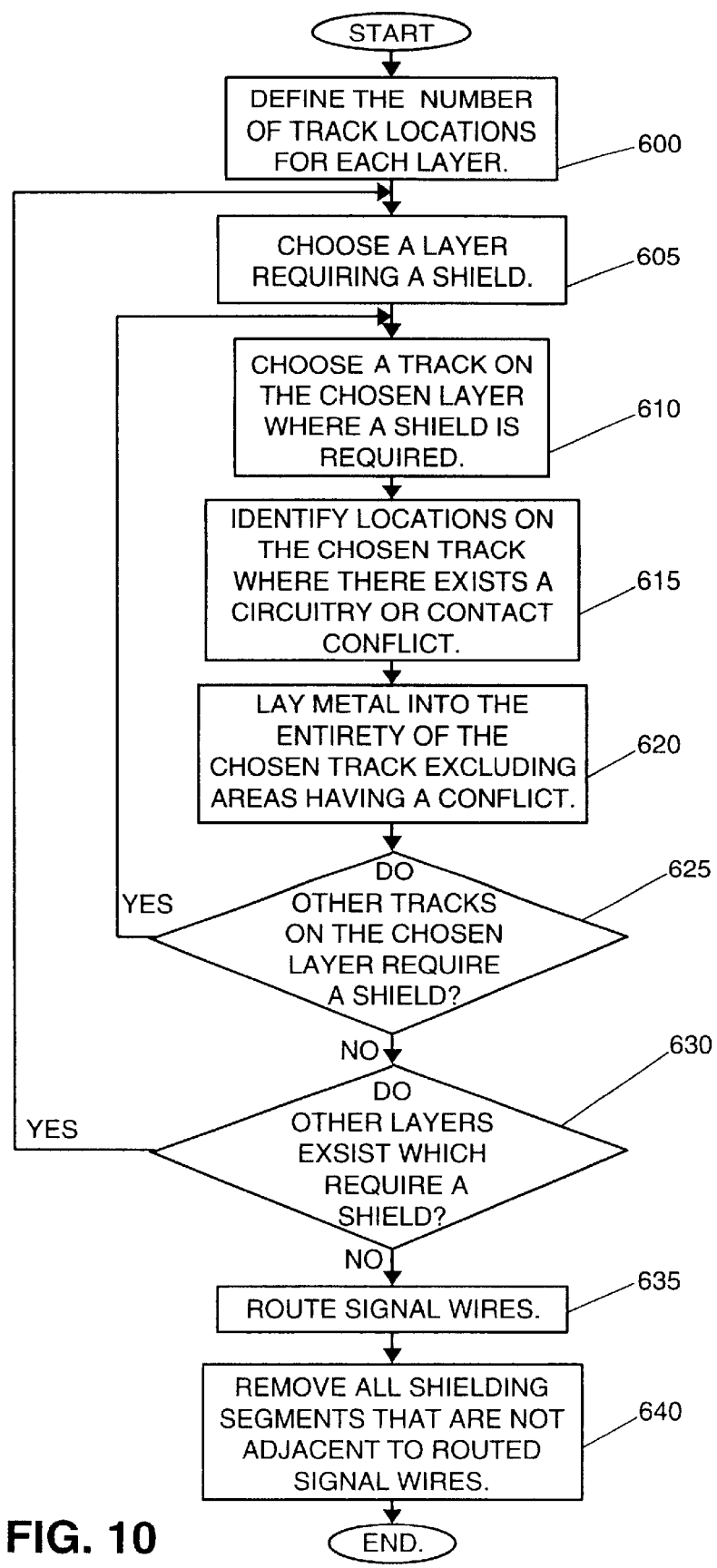
FIG. 10 shows a flowchart which describes the flow for a systematic shielding program for a shield insertion tool.

FIG. 10 is a chart which describes a shielding method according to the present invention. First, the number of track locations for each layer are defined 600. Next, a layer which requires a shield is chosen 605. Next, a track on the chosen layer which requires a shield is chosen 610. Locations on the chosen track are then identified where there exists a circuitry or contact conflict 615. Metal is then layed into the entire track, excluding areas having a conflict 620. Next, if other tracks on the layer remain which require a shield the process is repeated 625. If not, other remaining layers are treated in the same manner 630. Next, sensitive signal wires are routed, 635 and finally, all shielding segments that are not adjacent to routed signal wires are removed 640.

Figure 11:
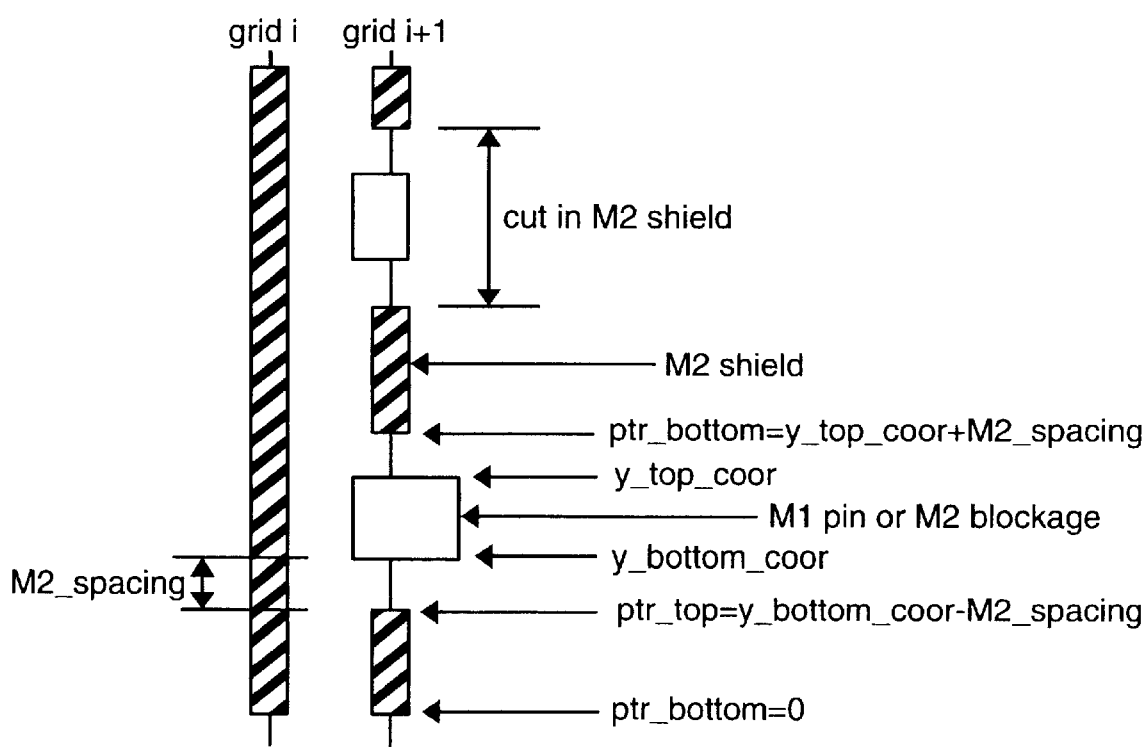
FIG. 11 shows the flowchart for a systematic shielding insertion algorithm.

FIG. 11 shows an example of the algorithm in application. As detailed above, after the design and technology file is read in, the pins and blockages are sorted as it determines the cut locations for them and which M2 and M3 shield grids are affected. From there, segments of wire shields are written out to a text file. This is done by starting at the bottom of the block and drawing a M2 wire W1 shown in FIG. 11, until a cut is hit and the wire segment ends. A new wire segment, W2, is drawn from the top of the previous cut, plus M2 spacing, up to the bottom of the next cut. This is done for each cut until the top of the block is reached for the current M2 shield grid. These steps are repeated for each M2 shield grid. The same is done for the M3 horizontal shield grids, except the wires are drawn from left to right. Clock, power and ground wires are also inserted, and vias are added to short the shield segments and power distribution wires together as often as possible.

The run time complexity of the shielding algorithm is $O(n^2)$ since each for loop for the shield grids have a nested loop for each cut, both of which have n elements. The memory needed is $O(n)$ since only the cut locations need to be stored.

Figure 12:
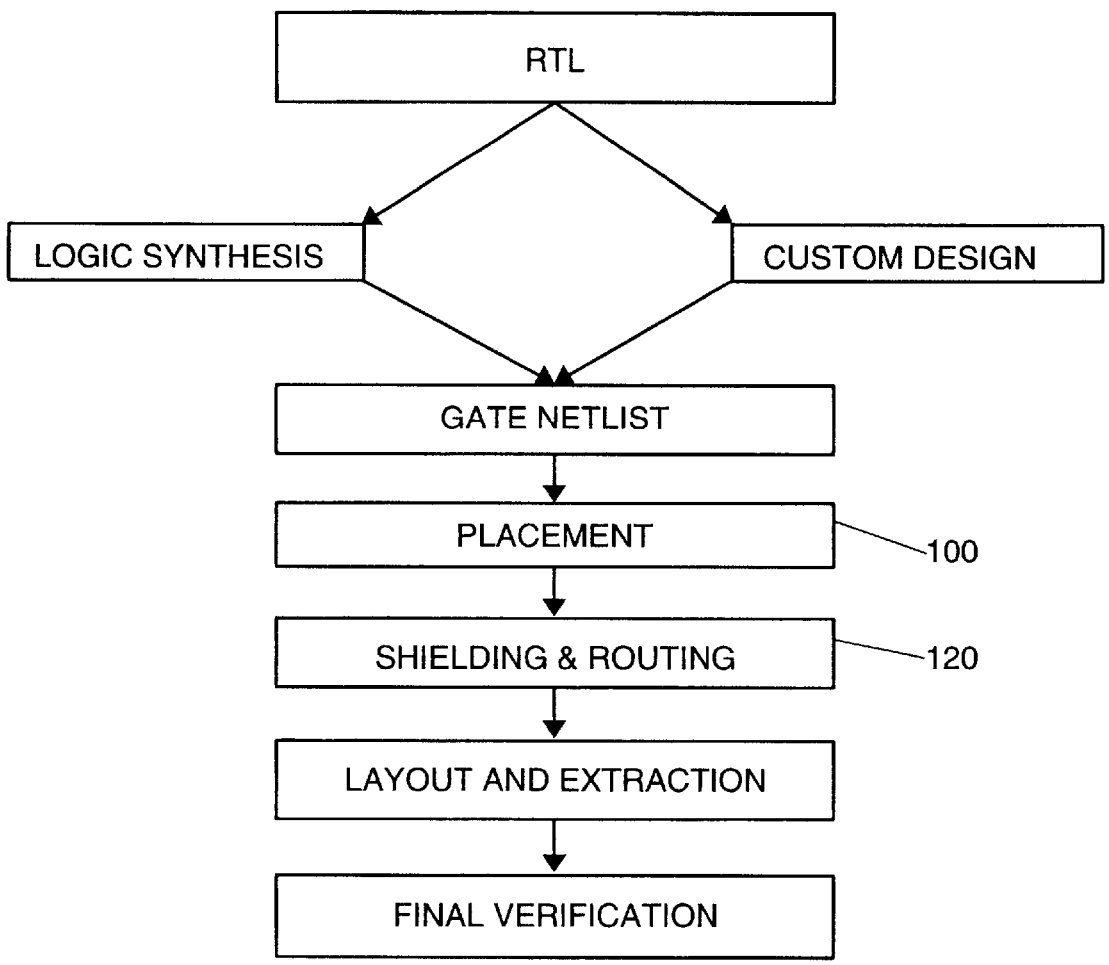
FIG. 12 shows the design flow chart for dynamic circuit design and synthesis.

The shield insertion method of the present invention can be used as part of a design flow for dynamic circuits. The design flow is shown in FIG. 12. The method is used after placement of cells, 100 and before routing 120, as shown in FIG. 12. Extra spacing between cells may be needed to allow extra routing tracks since full shielding takes up half of all available routing tracks. An iterative process between placement, shielding, and routing allows quick convergence on a completed block. Standard physical design checks and noise analysis follow once the block is completed. Routing of signals can be done with most routers.

The shield insertion method can be used on any design, whether custom or standard cell based; on dynamic circuits or others. For example, extra spacing between pins can be added in the standard cell library when possible based on a grid. An area router with gridless routing capabilities can be used. Also, area pins were used for output pins which allowed more landing points for the router.

For blocks where the router could not complete routing, extra spacing between cells and rows can be added to increase routing tracks. Another option is to make the cuts in the shield larger to allow more room for the router to access the pins.

If an automated flow is available for shielding and routing, layout resources are only needed for the design of the dynamic standard cells. This results in record completion of the blocks by one circuit designer and no mask designers beyond the standard cell layouts. The block area increase due to shielding occurs when the block is routing limited and local congestions in routing.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multi-layer circuit comprising:
    a first layer of circuits having a first plurality of signal wires aligned in a first direction in a first plane and a first plurality of shielding wires, wherein each of said shielding wires is aligned in said first direction in said first plane and is adjacent at least one of said first plurality of signal wires;
    a second layer of circuits having a second plurality of signal wires aligned in a second direction substantially orthogonal to said first direction in said second plane substantially parallel to said first plane and a second plurality of shielding wires wherein each of said shielding wires substantially aligned in said second direction in said second plane and is adjacent at least one of said second plurality of signal wires; and
    a third layer of circuits having a third plurality of signal wires substantially aligned in said first direction in a third plane substantially parallel to said first plane and a third plurality of shielding wires wherein each of said third plurality of shielding wires is substantially aligned in said first direction in said third plane and is adjacent at least one of said third plurality of signal wires, and wherein said second plane is between said first plane and said third plane.

2. The multi-layer circuit of claim 1 wherein said second layer of circuits act as a ground plane with respect to said first layer of circuits and said third layer of circuits.

3. The multi-layer circuits of claim 1 wherein each of said first plurality of shielding wires and a corresponding one of said third plurality of shielding wires is in a shielding plane substantially orthogonal to said first plane to form overlapping shields.

4. The multi-layer circuits of claim 1 wherein each of said first plurality of is in a first shield plane substantially orthogonal to said first plane and each of said third plurality of shield wires being offset from a corresponding one of said first plurality of shield wires in a second shield plane substantially parallel to said first shield plane to form staggered shield.

5. The multi-layer circuit of claim 1 further comprising:
a first cut in a one of said second plurality of shield wires to provide an opening through which a pin connected to said first layer of circuits is inserted.

6. The multi-layer circuit of claim 5 further comprising:
a second cut in a one of said third plurality of shield wires to provide an opening through which said pin is inserted.

7. The multi-layer circuit of claim 1 further comprising:
a first cut in a one of said second plurality of shield wires to provide an opening through which a pin connected to said first layer of circuits is inserted.

8. The multi-layer circuit of claim 1 further comprising:
a first cut in a one of said second plurality of shield wires to provide an opening through which a pin connected to said second layer of circuits is inserted.

9. The multi-layer circuit of claim 1 wherein at least one of first plurality of shielding wires is a VDD wire.

10. The multi-layer circuit of claim 1 wherein at least one of said first plurality of shielding wires is a VSS wire.

11. The multi-layer circuit of claim 1 wherein at least one of second plurality of shielding wires is a VDD wire.

12. The multi-layer circuit of claim 1 wherein at least one of said second plurality of shielding wires is a VSS wire.

13. The multi-layer circuit of claim 1 wherein at least one of said third plurality of shielding wires is a VDD wire.

14. The multi-layer circuit of claim 1 wherein at least one of said third plurality of shielding wires is a VSS wire.

15. A method for routing a multi-layer circuit comprising:
inserting a plurality of shield wires between a plurality of routing tracks in each layer of said multi-layer circuit;
determining a location of at least one cut in at least one of said plurality of shield wires;
generating said at least one cut; and
inserting at least one signal wire in a one of said plurality of routing tracks.

16. The method of claim 15 further comprising:
merging said at least one cuts in different layers that overlap.

17. The method of claim 15 wherein said step of determining said at least one cut comprises:
determining pin locations in a first layer;
determining blocking locations in said plurality of shield wires in a second layer that correspond to said pin locations in said first layer;
setting cuts for said blocking locations.

18. The method of claim 15 further comprising:
inserting clock wires.

19. The method of claim 15 further comprising:
inserting a VDD wire.

20. The method of claim 15 further comprising:
inserting a VSS wire.

21. The method of claim 15 further comprising:
reading a technology file.

22. The method of claim 21 further comprising:
reading a design file.

23. The method of claim 22 wherein said step of determining said at least one cut is determined data in said design file.

24. The method of claim 21 wherein said step of determining said at least one cut is determined data in said technology file.

25. The method of claim 15 further comprising:
removing each of said plurality of shield wires that are not proximate one of said plurality of signal wires.

* * * * *